United States Patent
Kim (10) Patent No.: US 7,741,891 B2
(45) Date of Patent: *Jun. 22, 2010

(54) DELAY LOCKED LOOP CIRCUIT

(75) Inventor: Kyung-Hoon Kim, Kyoungki-do (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/255,056

(22) Filed: Oct. 21, 2008

(65) Prior Publication Data

US 2009/0045857 A1    Feb. 19, 2009

Related U.S. Application Data

(63) Continuation of application No. 11/478,191, filed on Jun. 30, 2006, now Pat. No. 7,449,927.

(30) Foreign Application Priority Data

Sep. 29, 2005  (KR) .................. 10-2005-0090951
Dec. 2, 2005   (KR) .................. 10-2005-0117134

(51) Int. Cl.
*H03L 7/06* (2006.01)

(52) U.S. Cl. ..................... 327/158; 327/159

(58) Field of Classification Search .............. 327/156, 327/158

See application file for complete search history.

(56) References Cited

U.S. PATENT DOCUMENTS

| | | | |
|---|---|---|---|
| 6,259,288 B1 | 7/2001 | Nishimura | |
| 6,426,662 B1 | 7/2002 | Arcus | |
| 6,633,190 B1 | 10/2003 | Alvandpour et al. | |
| 6,859,081 B2 | 2/2005 | Hong et al. | |
| 6,867,627 B1 | 3/2005 | Murtagh | |
| 6,870,410 B1 | 3/2005 | Doyle et al. | |
| 6,876,240 B2 | 4/2005 | Moon et al. | |
| 6,940,768 B2 | 9/2005 | Dahlberg et al. | |
| 6,970,029 B2 | 11/2005 | Patel et al. | |
| 7,057,431 B2 * | 6/2006 | Kwak | ................... 327/158 |

(Continued)

FOREIGN PATENT DOCUMENTS

KR    10-2003-0058510 A    7/2003

(Continued)

OTHER PUBLICATIONS

Search Report issued by the Taiwanese Intellectual Property Office together with an Office Action on May 7, 2009.

*Primary Examiner*—Lincoln Donovan
*Assistant Examiner*—Ryan C Jager
(74) *Attorney, Agent, or Firm*—JP & T Law Firm PLC (57) ABSTRACT

A delay locked loop increases an operation margin of a delay locked loop by using an output clock having more advanced phase than a DLL output clock. A clock delay compensation block receives an external clock signal to thereby generate a first multi clock and a second multi clock. A phase control block compares the first multi clock with the second multi clock to generate phase control signal controlling a shifting operation. A multi-phase delay control block performs a shifting operation based on the phase control signal to control the clock delay compensation block.

26 Claims, 10 Drawing Sheets

U.S. PATENT DOCUMENTS

| | | | |
|---|---|---|---|
| 7,268,601 B2 * | 9/2007 | Kwak | 327/158 |
| 7,449,927 B2 * | 11/2008 | Kim | 327/156 |
| 2004/0027182 A1 * | 2/2004 | Brox et al. | 327/158 |
| 2004/0155686 A1 * | 8/2004 | Kim et al. | 327/158 |
| 2005/0093600 A1 * | 5/2005 | Kwak | 327/161 |
| 2005/0105349 A1 | 5/2005 | Dahlberg et al. | |

FOREIGN PATENT DOCUMENTS

TW 429680 4/2001

* cited by examiner

DELAY LOCKED LOOP CIRCUIT

RELATED APPLICATIONS

This application is a Continuation of U.S. application Ser. No. 11/478,191, filed Jun. 30, 2006 now U.S. Pat. No. 7,449,927, claiming priority of Korean Application Nos. 10-2005-0090951, filed Sep. 29, 2005, and 10-2005-0117134, filed Dec. 2, 2005, the entire contents of each of which are hereby incorporated by reference.

FIELD OF INVENTION

The present invention relates to a delay locked loop circuit; and, more particularly, to a memory device for controlling an output of the delay locked loop circuit in a synchronous dynamic random access memory (SDRAM) according to an operation condition such as pressure or temperature.

DESCRIPTION OF RELATED ARTS

Generally, a delay locked loop (DLL) is a circuit used for controlling timing of outputting data from a semiconductor memory device such as a dynamic random access memory (DRAM) to an external device by using an externally input clock signal. For transmitting data from the semiconductor memory device to a chipset or a CPU without any error, outputs of the semiconductor memory device are synchronized with a clock signal generated from the chipset or the CPU.

When a clock signal is transmitted to/from an internal control block in the semiconductor memory device, the clock signal is delayed because of an input clock buffer, a line load, a data output buffer and other blocks therein. Thus, there is a phase difference between an external clock signal and an internal clock signal generated inside the semiconductor memory device. For synchronizing the internal clock signal with the external clock signal, the DLL is used to compensate for the phase difference.

The DLL compensates a clock skew that occurs from delay of an internal clock by internal blocks in the semiconductor memory device to thereby synchronize timing of output of data from the semiconductor memory device with the external clock signal. As a result, timing of data output, which is sensed from a core area of the semiconductor memory device according to the internal clock signal through the data output buffer, is synchronized with the external clock signal.

Known DLL circuits may be classified as analog DLL and digital DLL circuits. Digital DLL circuits may be of a variety of implementations including register control DLL, a hybrid DLL, a synchronous mirror DLL, an estimation control DLL, and the like.

Figure 1:
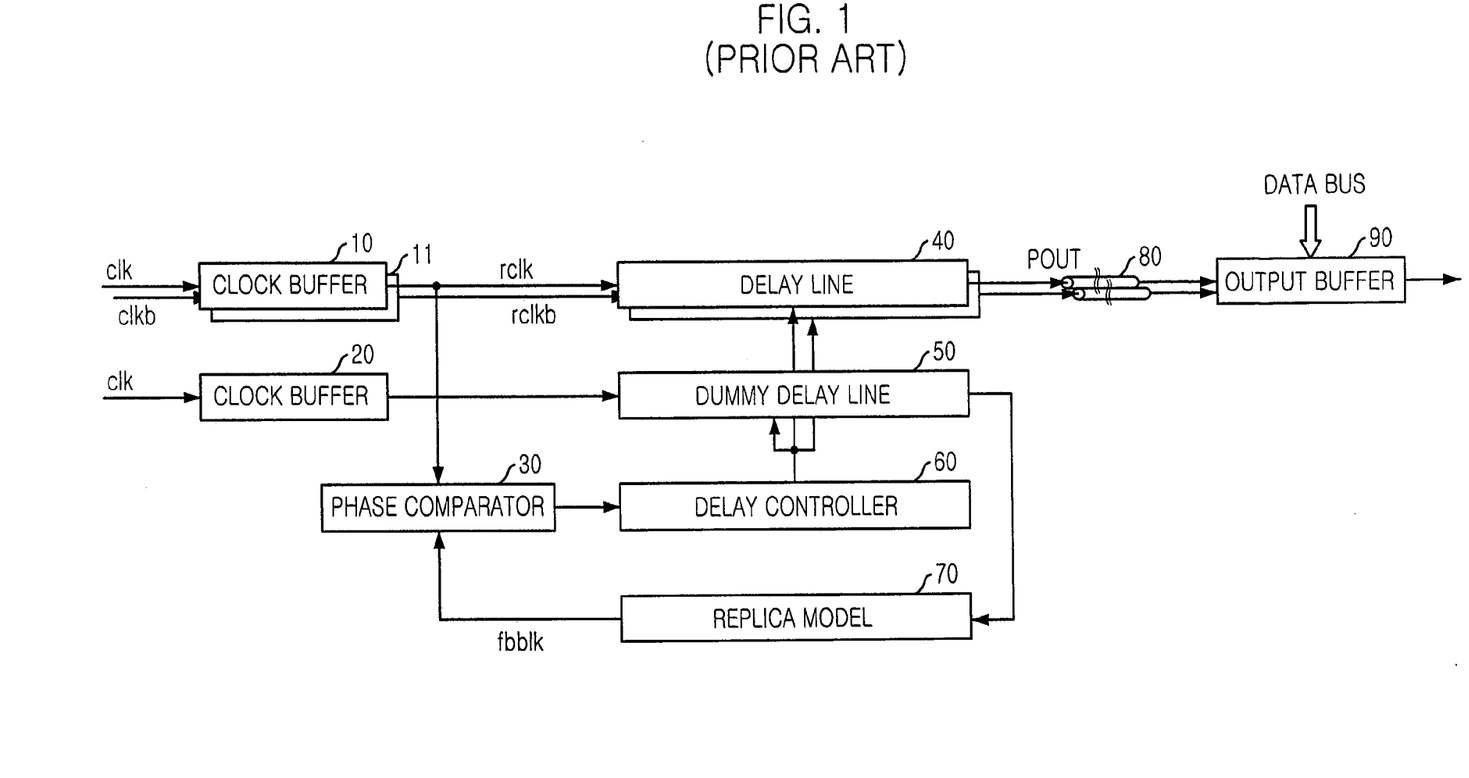
FIG. 1 is a block diagram of a conventional delay locked loop.

FIG. 1 is a block diagram showing a conventional delay locked loop.

The conventional delay locked loop includes input clock buffers 10 to 20, a phase comparator 30, a delay line 40, a dummy delay line 50, a delay controller 60, a replica model circuit 70, a clock signal line 80 and an output buffer 90.

The input clock buffer, including a rising edge clock buffer 10 and a falling edge clock buffer 11, buffers external clocks clk and clkb to generate an internal rising clock rclk and an internal falling clock fclk. The rising edge clock buffer 10 generates the internal rising clock rclk synchronized with a rising edge of the inputted clock clk, and the falling edge clock buffer 11 generates the internal falling clock fclk synchronized with a falling edge of the inputted clock clkb.

The phase comparator 30 compares a phase of the internal rising clock rclk with that of a feedback clock fbclk output from the replica model circuit 70 to detect a phase difference between the internal rising clock rclk and the feedback clock fbclk. For reducing power consumption, the phase comparator 30 can compare a divided clock, generated by a clock divider (not shown), having a low frequency, instead of the internal rising clock rclk, with the feedback clock fbclk. According to the comparison result, the phase comparator 30 generates an output signal for controlling the delay controller 60. The output signal presents one of three states, i.e., a lag state, a lead state and a locked state.

The delay controller 60 includes plural shift registers and controls the delay line 40 and the dummy delay line 50 based on the output signal received from the phase comparator 30. The delay line 40 delays the internal rising clock rclk and the internal falling clock fclk under a control of the delay controller 60. Likewise, the dummy delay line 50 delays an output clock of the input clock buffer 20 to thereby transfer the delayed clock into the replica model circuit 70 in order to generate the feedback clock fbclk. An internal structure of the dummy delay line 50 is similar to that of the delay line 40, but the dummy delay line 50 can reduce power consumption when the divided clock is input.

The replica model circuit 70 delays the output of the dummy delay line 50 by a predetermined amount estimated by modeling delay amount of a clock pass where an internal clock converted from an external clock is output to an external device after the external clock is input from an external device. The clock pass includes a plurality of delay elements such as a dummy clock buffer, an output buffer, a clock divider, and so on. These delay elements determine a skew value as a DLL characteristic. The replica model circuit 70 can be modeled by shrinking, simplifying or copying the plurality of delay elements.

The clock signal line 80 is used as a clock driver for generating a driving signal for controlling the output buffer 90 based on an output signal POUT output from the delay line 40. In synchronization with the driving signal, the output buffer 90 outputs data inputted from a core area of the semiconductor memory device through a data bus into an output terminal.

Figure 2:
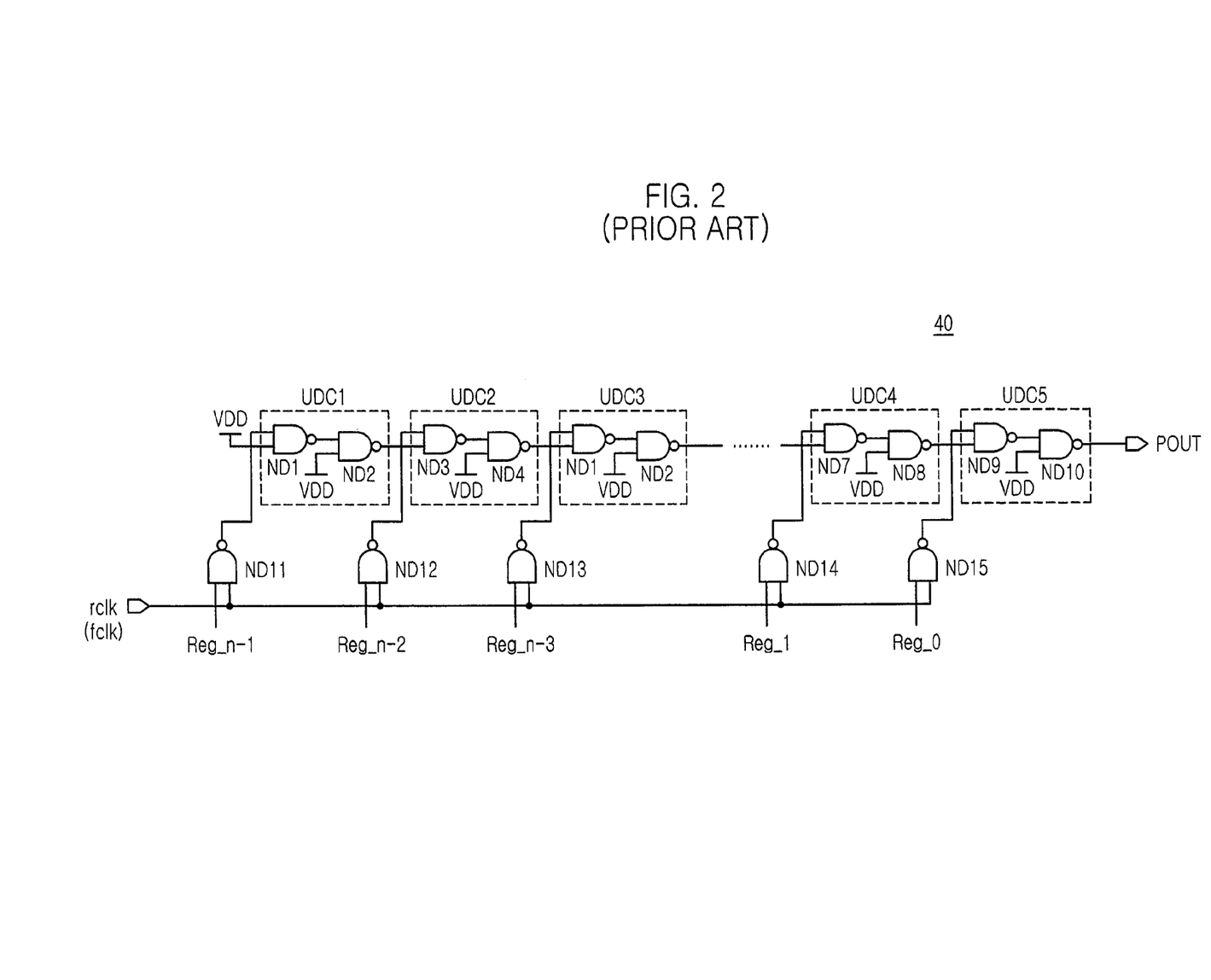
FIG. 2 is a schematic circuit diagram of a delay line.

FIG. 2 is a schematic circuit diagram depicting the delay line 40.

The delay line 40 includes a plurality of unit delay unit cells UDC1 to UDC5 and a plurality of NAND gates ND11 to ND15. Each of the plurality of unit delay unit cells UDC1 to UDC5 corresponds to each of a plurality of register signals Reg_n to Reg_0 output from the delay controller 60 and each of the plurality of NAND gates ND11 to ND15.

Each of the plurality of NAND gates ND11 to ND15 performs a logic NAND operation of each of the plurality of register signals Reg_n to Reg_0 and one of the internal rising clock rclk and the internal falling clock fclk. As a result of the logic NAND operation, a reference clock signal, i.e., one of the internal rising clock rclk and the internal falling clock fclk, is input to a unit delay unit cell receiving the corresponding register signal, i.e., one of Reg_n to Reg_0, having a logic high level. Thus, a delay pass is formed inside the delay line 40.

Each unit delay unit cell, e.g., UDC1, includes a first and a second NAND gates ND1 and ND2. The first NAND gate ND1 performs a logic NAND operation of a power voltage VDD and an output of the corresponding NAND gate, i.e., ND11; and the second NAND gate ND2 performs a logic NAND operation of a power voltage VDD and an output of the first NAND gate ND1. As other unit delay unit cells have the same structure, detailed description thereof are omitted.

The delay line 40 can include two delay line units having the above described structure for the internal rising clock rclk and the internal falling clock fclk. In this case, the delay line 40 can perform delay compensation operations for the internal rising clock rclk and the internal falling clock fclk at the same time. As a result, a duty ratio distortion can be maximally suppressed.

The conventional DLL generates a DLL output clock having only one phase, and the DLL output clock is used for controlling timing of data output from the semiconductor memory device and for driving plural control circuits therein. However, if an operation margin of the DLL output clock is decreased under high frequency operation or a change of an operation condition such as pressure, temperature or an input voltage level, operation reliability of the semiconductor memory device drops when one DLL output clock having one phase is used for controlling the plural control circuits.

SUMMARY OF THE INVENTION

It is an object of the present invention to provide a semiconductor memory device that increases an operation margin of a delay locked loop by using an output clock having different phase with a DLL output clock.

It is another object of the present invention to provide a semiconductor memory device for controlling an output of a delay locked loop (DLL) circuit operating at high frequency or with a change of an operation condition such as pressure, temperature or input voltage level.

In accordance with an aspect of the present invention, there is provided a delay locked loop including a clock delay compensation block for receiving a clock signal inputted from an external to thereby generate a first multi clock and a second multi clock. A phase control block compares a first multi clock with the second multi clock to generate a phase control signal controlling a shifting operation. A multi-phase delay control block performs a shifting operation based on the phase control signal to control the clock delay compensation block.

BRIEF DESCRIPTION OF THE DRAWINGS

The above and other objects and features of the present invention will become better understood with respect to the following description of the specific embodiments given in conjunction with the accompanying drawings, in which.

DETAILED DESCRIPTION OF THE INVENTION

Hereinafter, a memory device in accordance with specific embodiments of the present invention will be described in detail with reference to the accompanying drawings.

A semiconductor memory device according to the present invention particularly provides an enhanced delay locked loop (DLL) function.

Figure 3:
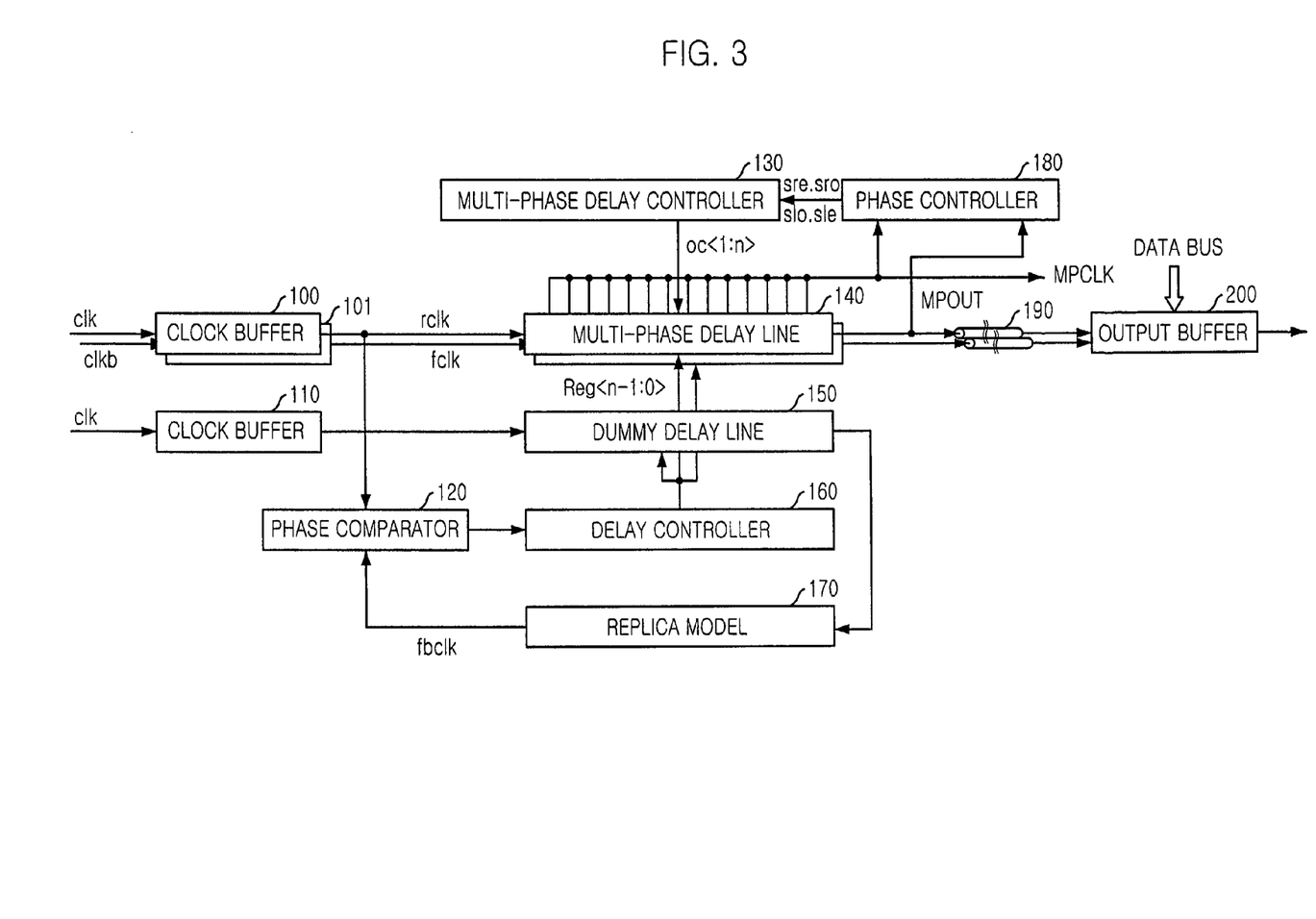
FIG. 3 is a block diagram of a delay locked loop for use in a semiconductor memory device according to an embodiment of the present invention.

FIG. 3 is a block diagram showing a delay locked loop for use in a semiconductor memory device according to an embodiment of the present invention.

The delay locked loop includes a clock delay compensation block, a phase controller 180 and a multi-phase delay controller 130. The clock delay compensation block includes a clock buffer 100, 101 and 110, a phase comparator 120, a delay controller 160, a multi-phase delay line 140, a dummy delay line 150, a replica model 170 and an output buffer 200.

The clock delay compensation block receives a clock signal clk and clkb inputted from an external to generate a first multi clock MPCLK and a second multi clock MPOUT. Receiving the first multi clock MPCLK with the second multi clock MPOUT, the phase controller 180 compares the first multi clock MPCLK with the second multi clock MPOUT; and, based on the comparison result, generates phase control signals sre, src, slo and sle. The phase control signals sre, src, slo and sle are used for controlling a shifting operation. The multi-phase delay controller 130 performs the shifting operation based on the phase control signals sre, src, slo and sle in order to control the clock delay compensation block.

The clock buffer 100 and 101 receives the clock signal clk and clkb and buffers the clock signal clk and clkb to generate rising and falling clocks rclk and fclk. The clock buffer includes a rising edge clock buffer 100 and a falling edge clock buffer 101. Receiving the clock signal clk and clkb, the rising edge clock buffer 101 generates the rising clock rclk synchronized with a rising edge of the clock signal clk. Likewise, the falling edge clock buffer 101 receiving the clock signal clk and clkb having an opposite phase of the clock signal clk generates the falling clock fclk synchronized with a falling edge of the clock signal clk.

The phase comparator 120 compares the rising clock rclk, the falling clock fclk or both with a feed-back internal clock fbclk to output a comparison result into the delay controller 160. In another embodiment, the phase comparator 120 receives a divided clock outputted from a clock divider (not shown) and compares the divided clock with the feed-back internal clock fbclk in order to reduce power consumption. Since the divided clock output from the clock divider has a lower frequency than the rising or falling clock rclk or fclk, the phase comparator 120 can reduce power consumption in comparison operations. An output signal which is output from the phase comparator 120 to the delay controller 60 according to the comparison result represents one of three states: lead, lag or locking.

Based on the comparison result of the phase comparator 120, the delay controller 160 performs a shifting operation to output a register signal Reg_n to Reg_0 to the multi-phase delay line 140 and the dummy delay line 150 for controlling a phase delay amount. Herein, n is positive integer. The delay controller 160 includes a plurality of shift registers, and the plurality of shift registers can determine an initial maximum or minimum phase delay amount of the multi-phase delay line 140 and the dummy delay line 150.

The multi-phase delay controller 130, including plural bidirectional shift registers, outputs a delay control signal oc<1:n> to the multi-phase delay line 140 according to the phase control signals sre, sro, slo and sle outputted from the phase controller 180. The phase control signals includes an even right shift signal sre, an odd right shift signal sro, an even left shift signal sle and an odd left shift signal slo.

According to the delay control signal oc<1:n> and the register signal Reg_n to Reg_0, the multi-phase delay line 140 delays phases of the rising and falling clocks rclk and fclk to generate the first multi clock MPCLK and the a second multi clock MPOUT. The first multi clock MPCLK have a different phase from the second multi clock MPOUT. The multi-phase delay line 140 delays the rising and the falling clocks based on the comparison result to generate the second multi clock MPOUT and generates the first multi clock MPCLK in response to the delay control signal oc<1:n> output from the multi-phase delay controller 130.

The dummy delay line 150 controlled by the delay controller 160 delays an output signal of the clock buffer 110 receiving the clock signal clk to output a delayed signal to the replica model 170. The replica model 170 delays the output of the dummy delay line 150 by a predetermined amount modeled based on delay elements to generate the feed-back internal signal fbclk.

The delay elements include plural units in a clock path between an external clock input and an internal clock output except for a portion inside the delay locked loop, i.e., the multi-phase delay line 140, in order to synchronize data output in synchronization with the second multi clock MPOUT with the external clock signal. As a result, an accurate modeling of the delay elements determines a skew considered as a critical performance factor of the semiconductor memory device. For accurate modeling, the replica model 170 can have a structure for shrinking, simplifying or copying the delay elements such as the clock buffer, the clock divider, the output buffer and the like.

As described above, the phase controller 180 generates phase control signals sre, src, slo and sle used for controlling a shifting operation of the multi-phase delay controller 130 according to the second multi clock MPOUT and the first multi clock MPCLK. The phase controller 180 can adjust a phase of the first multi clock MPCLK output from the multi-phase delay line 140 based on a PVT condition such as a fabrication process, voltage level or temperature.

A clock signal line 190 transfers the second multi clock MPOUT from the multi-phase delay line 140 to the output buffer 200. The output buffer 200 receives a data signal transmitted through a data bus and outputs the data signal externally in synchronization with the second multi clock MPOUT.

Figure 4:
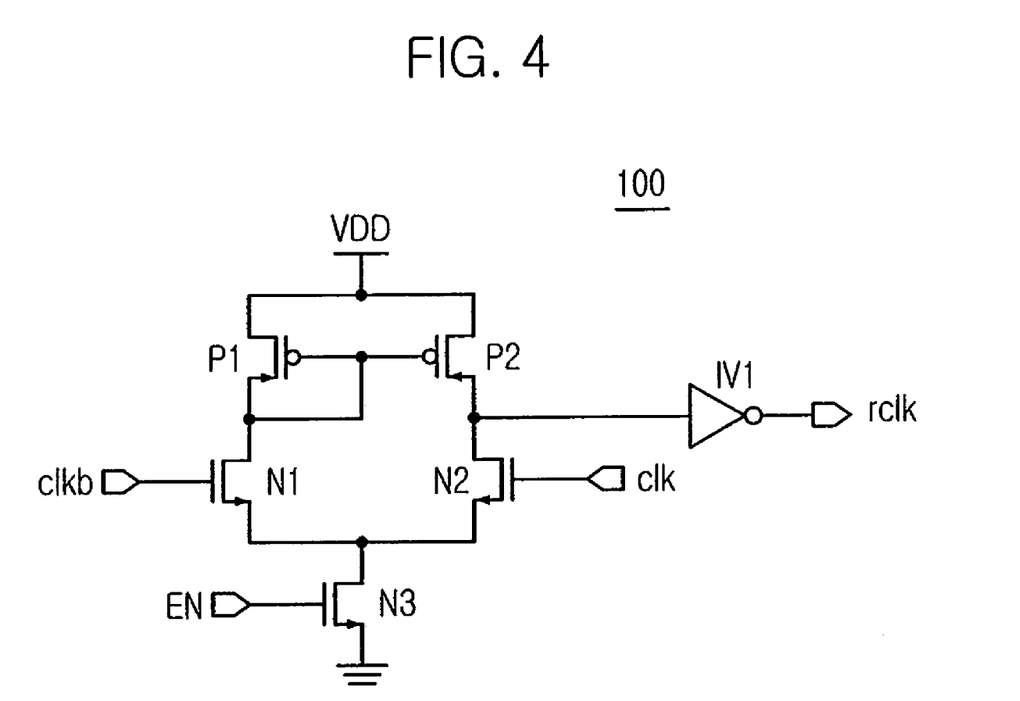
FIG. 4 is a schematic circuit diagram of an embodiment of a clock buffer shown in FIG. 3.

FIG. 4 is a schematic circuit diagram describing an embodiment of the clock buffer 100 or 101 shown in FIG. 3.

The clock buffer 100 includes a differential amplifier having PMOS transistors P1 and P2, NMOS transistors N1, N2 and N3, and an inverter IV1. The clock signals clk and clkb are input to input terminals of the differential amplifier, i.e., gates of the NMOS transistors N1 and N2. An enable signal EN is input to a gate of the NMOS transistor N3 for enabling the differential amplifier. PMOS transistors P1 and P2 are between the NMOS transistors N1 and N2 and a power voltage VDD. An output signal of the differential amplifier, output at a drain of the NMOS transistor N2, is inverted by the inverter IV1 and generated as the rising clock rclk.

Clock buffers 101 and 110 have similar structure. In the clock buffer 101, the clock signals clk and clkb are input to the input terminals of the differential amplifier in reverse order, as compared with the clock buffer 100, to generate the falling clock fclk.

Figure 5:
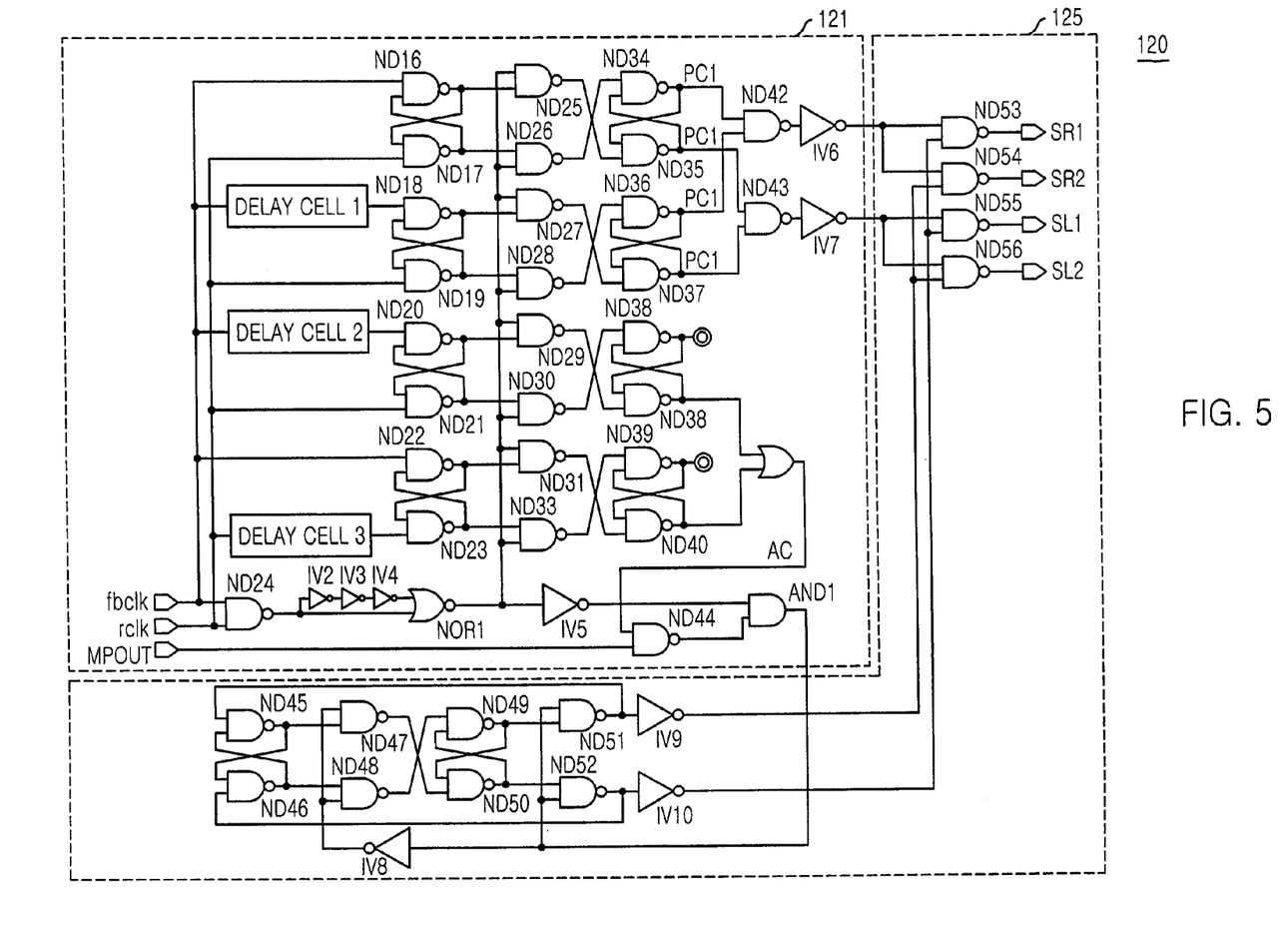
FIG. 5 is a schematic circuit diagram of an embodiment of the phase comparator shown in FIG. 3.

FIG. 5 is a schematic circuit diagram of an embodiment of the phase comparator 120 shown in FIG. 3.

The phase comparator 120 includes a phase comparison unit 121 and a shift register controller 125. The phase comparison unit 121 includes plural delay cells DC1 to DC3, plural logic NAND gates ND16 to ND44, plural inverters IV2 to IV7, a logic OR gate OR1, a logic NOR gate NOR1 and a logic AND gate AND1. The delay cell, e.g., DC1, delays the rising and falling clocks rclk and fclk with a predetermined time.

The phase comparison unit 121 compares the feed-back internal signal fbclk, the rising or falling clock rclk or fclk and the second multi clock MPOUT and outputs information indicating a lead, a lag, a locking based on the comparison result. A right-shift operation is determined by comparison signals PC1 and PC3 and a left-shift operation is decided by comparison signals PC2 and PC4. The right-shift and left-shift operations are performed for controlling a delay amount of the multi-phase delay line 140 and the dummy delay line 150.

In the phase comparison unit 121, the delay cells DC1 to DC3 delay the feed-back internal signal and the rising or falling clock by a predetermined time. A logic block configured to plural logic NAND gates and plural inverters compare the feed-back internal signal fbclk, the rising or falling clock rclk or fclk and a delayed feed-back internal signal and a delayed rising or falling clock outputted from the delay cells DC1 to DC3 to output a comparison result. For reducing a locking operation time when there is a big phase difference between the rising or falling clock rclk or fclk and the feed-back internal signal fbclk, a delay acceleration mode control unit receives the second multi clock MPOUT and compares a comparison result AC outputted from the logic block and the second multi clock MPOUT to enable a delay acceleration mode.

The phase comparison unit 121 determines whether a shifting operation is performed based on the second multi clock MPOUT or the comparison result of the rising or falling clock rclk or fclk and the feed-back internal signal fbclk. For example, if a divider having 1/8 ratio is used, phases between two clocks are compared by using eight unit delay cells. A divided clock or not-divided clock is used according to the comparison result for the right or left shifting operation.

In response to three states outputted from the phase comparison unit 121, the shift register controller 125 generates a different combination of phase comparison signals SR1, SR2, SL1 and SL2. If the information represents a locking state, a phase control signal is not activated.

Figure 6:
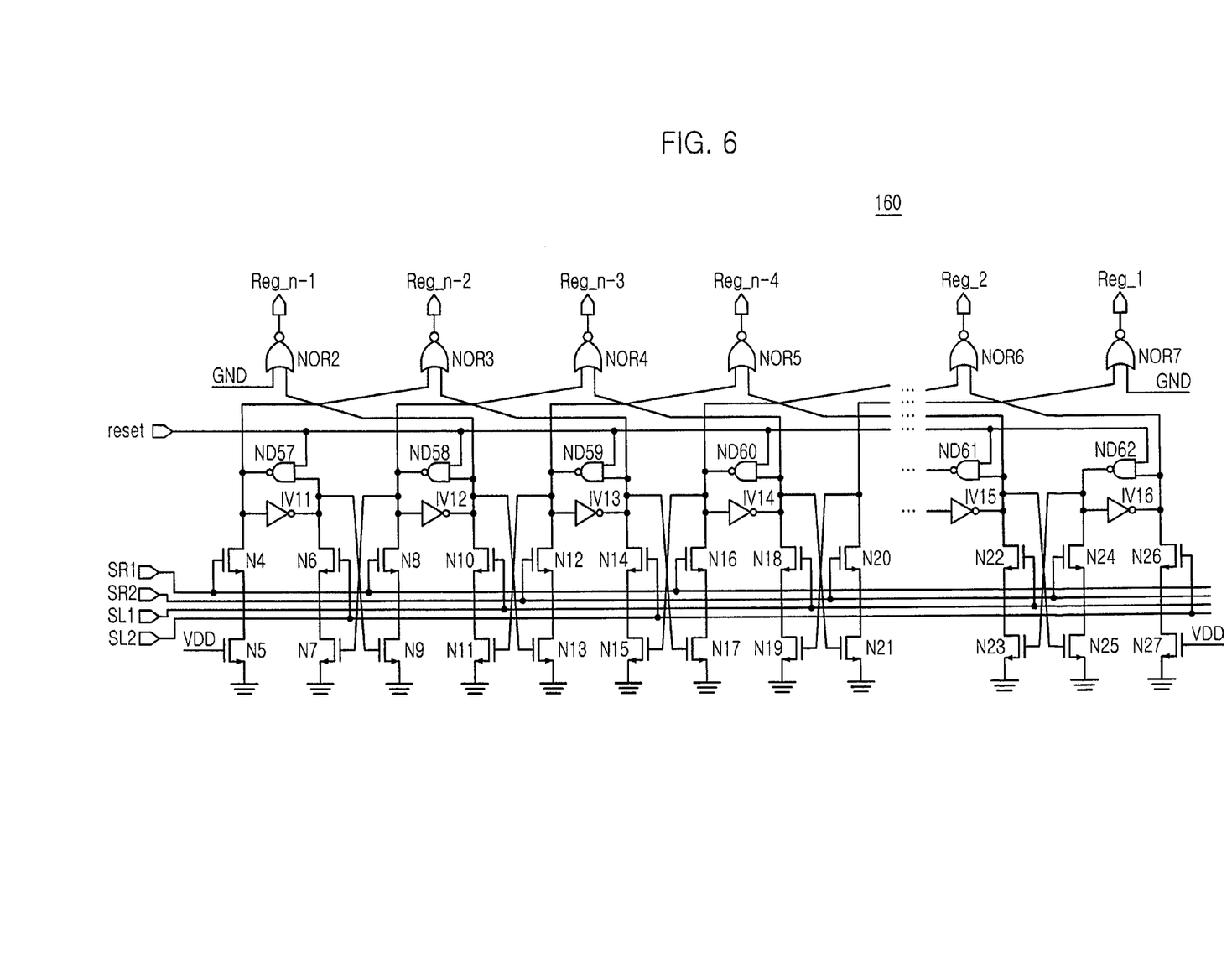
FIG. 6 is a schematic circuit diagram depicting a delay controller shown in FIG. 3.

FIG. 6 is a schematic circuit diagram of the delay controller 160 shown in FIG. 3.

The delay controller 160, configured in plural stages, includes a plurality of logic NOR gates NOR2 to NOR7, a plurality of logic NAND gates ND57 to ND62, a plurality of logic NMOS transistor N4 to N27 and a plurality of inverter IV11 to IV16.

Each stage, e.g., the stage outputting a register signal Reg_1, includes an inverting latch, a switching unit and a logic unit. The switching unit comprises four NMOS transistors, e.g., N8 to N11, to control a left-shift or right-shift operation in response to the plural phase comparison signals SR1, SR2, SL1 and SL2. The inverting latch comprises a logic NAND gate, e.g., ND58, and an inverter, e.g., IV12, to latch an output of the switching unit. The logic unit, e.g., NOR3, receives outputs of a previous stage and a next stage and performs a logic operation to thereby generate a register signal, e.g., Reg_1.

The logic units of the plural stages are responsive to the plural phase comparison signals SR1, SR2, SL1 and SL2 to perform a shift operation and generate the register signals Reg_n−1 to Reg_0. According to an initial condition, the delay controller 160 can determine a minimum or maximum delay amount of the multi-phase delay line 140 and the dummy delay line 150. Also, for performing a proper shift operation, e.g., avoiding a shifting collapse, the delay controller 160 prevents an overlap of the plural phase comparison signals SR1, SR2, SL1 and SL2.

Figure 7:
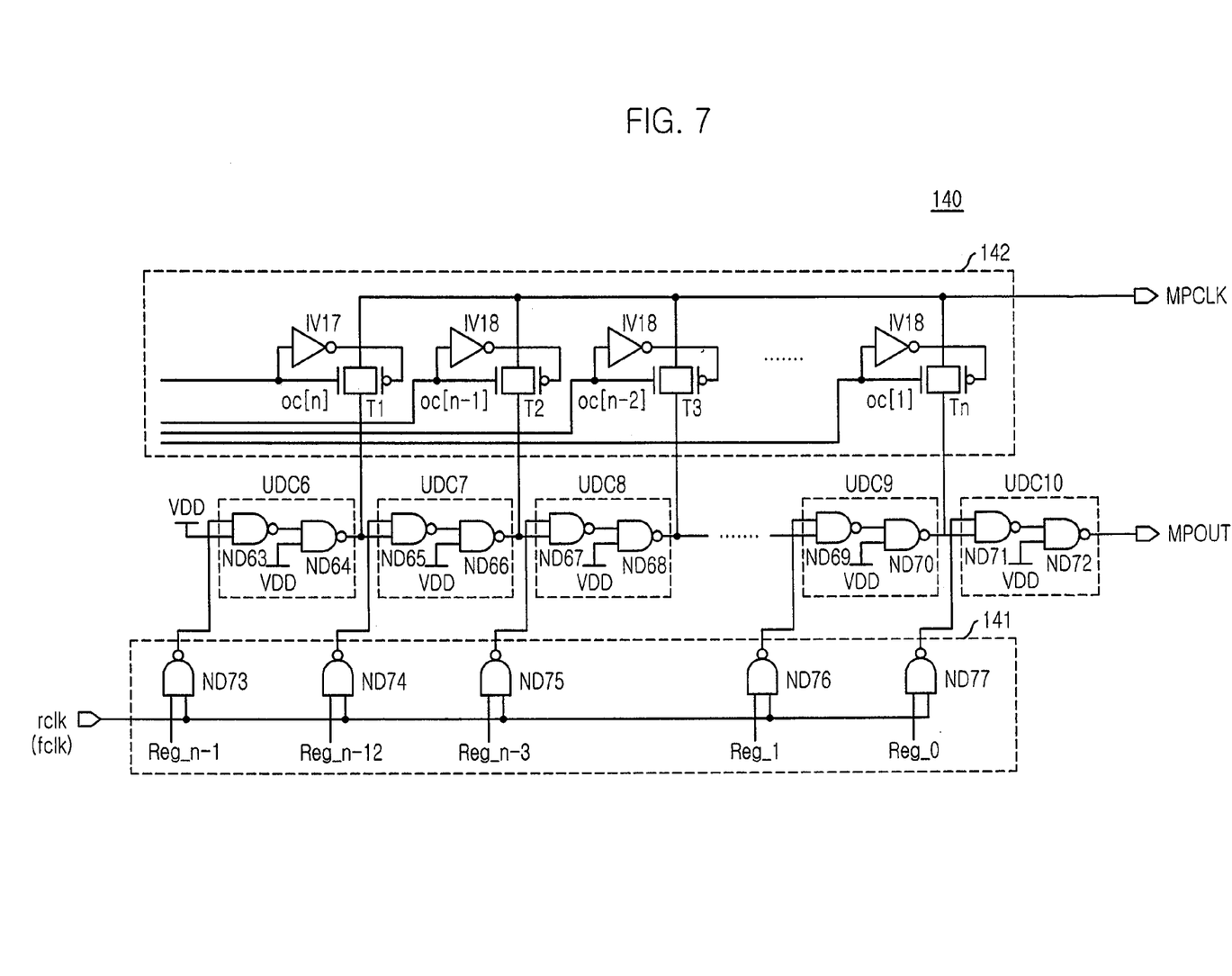
FIG. 7 is a schematic circuit diagram of a multi-phase delay line 140 shown in FIG. 3.

FIG. 7 is a schematic circuit diagram of the multi-phase delay line 140 shown in FIG. 3.

The multi-phase delay line 140 includes a first logic combination unit 141, a plurality of delay unit cells UDC6 to UDC10 and an output controller 142.

The first logic combination unit 141 comprises plural NAND gates to perform a logic operation of the rising or the falling clock rclk or fclk and the register signals Reg_n−1 to Reg_0 to output the result into each delay unit cell. Accordingly, a delay path is formed by a delay unit cell receiving a register signal having a logic high level among the plurality of delay unit cells UDC6 to UDC10. Each of the plurality of delay unit cells UDC6 to UDC10 corresponds to each of the register signals Reg_n−1 to Reg_0.

The plurality of delay unit cells UDC6 to UDC10, comprising plural logic NAND gates ND63 to ND72, controls a delay amount of the second multi clock MPOUT based on an output of the first logic combination unit 141. For example, a delay unit cell UDC6 includes two logic NAND gates ND63 and ND64. The logic NAND gate ND63 receives a power voltage VDD and an output of the logic NAND gate 73 and generates an output of the logic NAND operation to the logic NAND gate ND64; and, likewise, the logic NAND gate ND65 performs the logic NAND operation of a power voltage VDD and an output of the logic NAND gate 63 and outputs the result to the output controller 142 and a next delay unit cell UDC7. The last delay unit cell UDC10 outputs the second multi clock MPOUT to the clock signal line 190. Delay unit cells UDC 7 to 10 have similar structure and, thus, are not further described in detail.

The output controller 142 includes plural transmission gates Ti to Tn and plural inverters IV17 to IV20. Each of the plural transmission gates is selectively turned on in response to the delay control signals oc<n:1> for outputting plural signals generated from the plural delay unit cells UDC6 to UDC10 as the first multi clock MPCLK. Herein, n is a positive integer.

Figure 8:
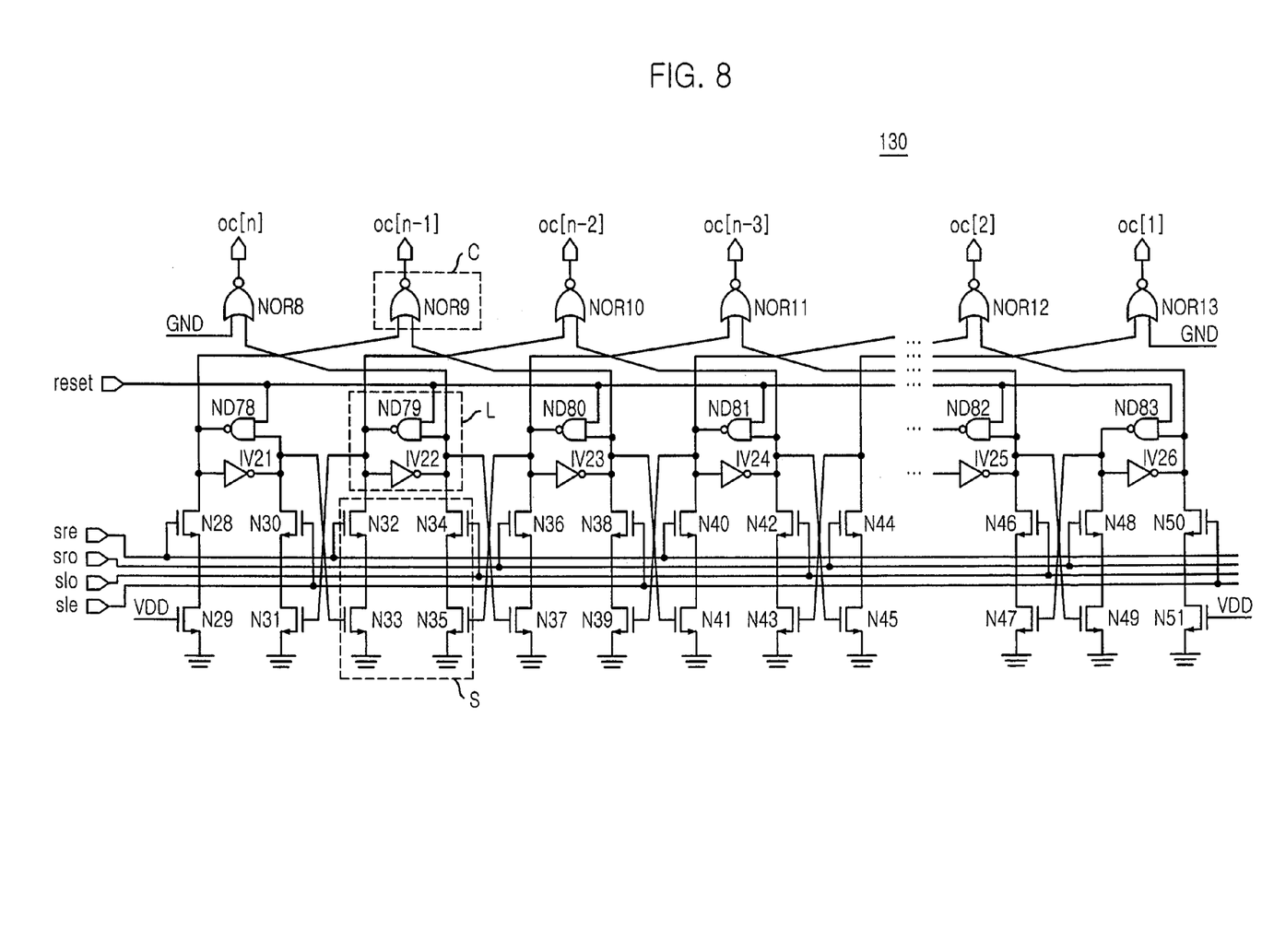
FIG. 8 is a schematic circuit diagram of a multi-phase delay controller 130 shown in FIG. 3.

FIG. 8 is a schematic circuit diagram of the multi-phase delay controller 130 shown in FIG. 3.

The multi-phase delay controller 130, having plural stages, includes a plurality of logic NOR gates NOR8 to NOR12, a plurality of logic NAND gates ND78 to ND83, a plurality of NMOS transistors N28 to N51 and a plurality of inverter IV21 to IV26. Each stage of the multi-phase delay controller 130 includes an inversion latch L, a switching unit S and a second logic unit C.

In a stage outputting a delay control signal oc[n−1], the inversion latch L has a logic NAND gate 79 and an inverter IV22. For an initialization, a reset signal is inputted to the logic NAND gate 79. The switching unit S controls a logic value latched in the inversion latch L in response to the phase control signals sre, sro, slo, sle outputted from the phase controller 180. The second logic unit C of each stage receives outputs of each second logic unit in a previous stage and a next stage and performs a logic operation to thereby generate the delay control signal oc[n−1].

In the switching unit S, a NMOS transistor N32 is controlled by the even right shift signal sre, and a NMOS transistor N33 controlled by an inversion latch of the prior stage is used for supplying a ground voltage to the inversion latch L with the NMOS transistor N32. Likewise, a NMOS transistor N34 controlled by the odd right shift signal sro and a NMOS transistor controlled by an inversion latch of the next prior are used for supplying a ground voltage to the inversion latch L.

Referring to FIG. 8, the switching unit S of each stage is controlled by different combinations of the phase control signals sre, sro, slo, sle: for example, sre and sle, sre and slo, sro and sle, and so on. Herein, according to an initial condition, the multi-phase delay controller 130 can determine a minimum or maximum delay amount of the multi-phase delay line 140 and the dummy delay line 150. Also, for performing a proper shift operation, e.g., avoiding a shifting collapse, the delay controller 160 prevents the phase control signals sre, sro, slo, sle from an overlap of two logic high state signal.

Figure 9:
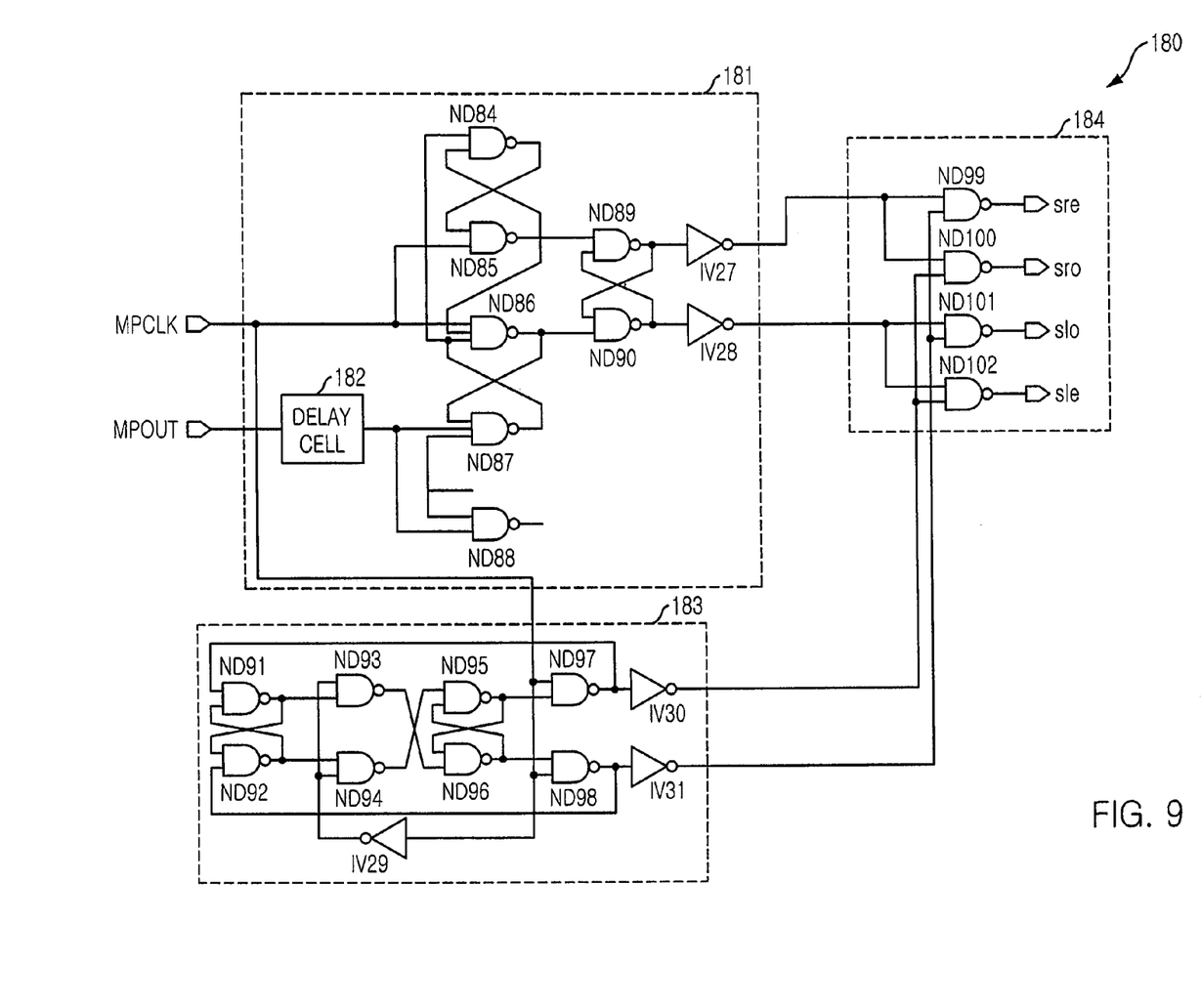
FIG. 9 is a schematic circuit diagram of a phase controller shown in FIG. 3.

FIG. 9 is a schematic circuit diagram of the phase controller 180 shown in FIG. 3.

The phase controller 180 includes a phase comparing block 181, a flip-flop block 183 and a third logic block 184.

The phase comparing block 181, including a delay cell 182, a plurality of logic NAND gates ND84 to ND90 and plural inverters IV27 and IV28, compares the first multi clock MPCLK with the second multi clock MPOUT. The phase comparing block 181 outputs the comparison result to the third logic block 184.

The flip-flop block 183, comprising plural logic NAND gates and plural inverters IV29 to IV31, receives the first multi clock MPCLK and outputs flip-flopped multi-clocks to the third logic block 184.

Receiving the comparison result output from the phase comparing block 181 and the flip-floped multi-clocks output from the flip-flop block 183, the third logic block 184 performs different logic combinations to generate the phase control signals sre, sro, slo, sle.

Figure 10:
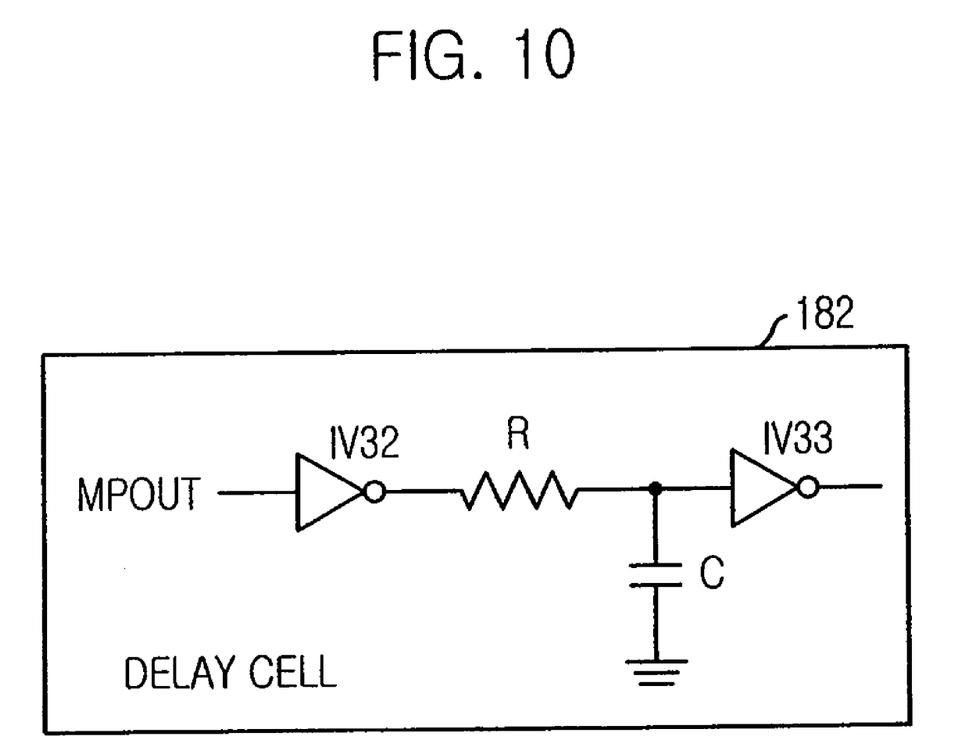
FIG. 10 is a schematic circuit diagram of a delay cell shown in FIG. 9.

FIG. 10 is a schematic circuit diagram of the delay cell 182 shown in FIG. 9.

The delay cell 182 includes a RC delay cell having plural inverters IV32 and IV33, a register R and a capacitor C. The delay cell 182 delays the second multi clock MPOUT by a predetermined time based on the register R and the capacitor C.

Operation is described as follows. The phase controller 180 compares a phase of the first multi clock MPCLK with that of the second multi clock MPOUT to generate a different combination of the phase control signals sre, sro, slo and sle based on the comparison result. The phase controller 180 has a predetermined delay amount set by a mode register set (MRS) or a fuse-cut.

As previously described, the even right shift signal sre and the odd right shift signal sro are used for a right shifting operation, i.e., increasing a delay amount of the multi-phase delay line 140 and the dummy delay line 150. The even left shift signal sle and the odd left shift signal slo are used for a left shifting operation, i.e., decreasing a delay amount of the multi-phase delay line 140 and the dummy delay line 150. Each of these signals, i.e., the phase control signals sre, sro, slo and sle, is alternatively generated in a pulse shape.

The phase controller 180 detects a phase difference between the first multi clock MPCLK and the second multi clock MPOUT and outputs the phase control signals sre, sro, slo and sle to the multi-phase delay controller 130 for controlling a delay amount of the first multi clock MPCLK and the second multi clock MPOUT.

In response to the phase control signals sre, sro, slo and sle, the multi-phase delay controller 130 controls a shifting operation and outputs the delay control signal oc<1:n> to the multi-phase delay line 140.

According to the delay control signal oc<1:n>, one of plural transmission gates T1 to Tn in the multi-phase delay line 140 is turned on. Thus, the multi-phase delay line 140 generates the first multi clock MPCLK having more advanced phase than the second multi clock MPOUT output from the delay unit cell UDC10. At this time, when a reset signal is input during an initial operation, a delay control signal oc<1> becomes a logic high level, and, responsive to the phase control signals sle and slo, a phase of the first multi clock MPCLK leads that of the second multi clock MPOUT.

The multi-phase delay line 140 in accordance with an embodiment of the present invention, can be controlled according to a condition including pressure, voltage level, temperature, and the like. A multi-phase delay line according to another embodiment of the present invention selects and outputs one of the plural delay control signals, e.g., oc<1:n>, via a feedback loop such as a phase controller, i.e., a feedback loop for reflecting a comparison result of outputs MPCLK and MPOUT, is eliminated. One of the plural delay control signals can be selected by a mode register set MRS and a fuse. Further, by using a mode register set MRS and a fuse, a delay amount of the feedback loop embodied in the delay locked loop can be adjusted.

Although only one phase information is additionally output from the multi-phase delay line 140 according to the embodiment of the present invention shown in FIG. 3, at least one phase information can be generated by using plural outputs of the transmission gates T1 to T5 in a multi-phase delay line in accordance with another embodiment of the present invention.

As above described, by using a clock signal having multi phases, a semiconductor memory device according to the present invention can control an output of a delay locked loop (DLL) circuit according to a high frequency operation or a change of an operation condition such as a pressure, a temperature or an inputted voltage level and improve an operation margin of the delay locked loop in the semiconductor memory device.

The present application contains subject matter related to the Korean patent applications Nos. KR 2005-0090951 and KR 2005-0117134, filed in the Korean Patent Office on Sep. 29, 2005 and on Dec. 2, 2005 respectively, the entire contents of which being incorporated herein by references.

While the present invention has been described with respect to certain specific embodiments, it will be apparent to those skilled in the art that various changes and modifications may be made without departing from the spirit and scope of the invention as defined in the following claims.

What is claimed is:

1. A delay locked loop, comprising:
a clock delay compensation block configured to receive rising and falling clocks of an input clock and to generate a first multi clock and a second multi clock in response to the rising and falling clocks;
a phase control block configured to receive the first multi clock and the second multi clock and to generate a phase control signal controlling a shifting operation based on the first multi clock and the second multi clock; and
a multi-phase delay control block configured to perform the shifting operation to control the clock delay compensation block in response to the phase control signal,
wherein the multi-phase delay control block includes:
a switching unit for controlling a left-shift or right-shift operation in response to the phase control signal;
a latching unit for latching an output of the switching unit; and
a second logic combination unit for performing a logic operation on outputs of the switching unit to generate a delay control signal for controlling the clock delay compensation block.

2. The delay locked loop as recited in claim 1, wherein the clock delay compensation block includes:
a phase comparator for comparing the rising and the falling clocks with a feed-back internal clock to output a comparison result;
a delay controller for performing a shifting operation based on the comparison result to generate a register signal controlling a phase delay amount;
a multi-phase delay line for delaying the rising and the falling clocks based on the comparison result to generate the second multi clock and generating the first multi clock in response to the delay control signal outputted from the multi-phase delay control block, wherein the first multi clock has a different phase with the second multi clock;
a dummy delay line for delaying one of output signals of the clock buffer;
a replica model for delaying an output of the dummy delay line by a predetermined amount modeled based on delay elements to generate the feed-back internal signal; and
an output buffer for synchronizing data input through a data bus with the second multi clock to generate the synchronized data.

3. The delay locked loop as recited in claim 2, wherein the multi-phase delay line includes:
a first logic combination unit for generating a logic operation of the rising or falling clock and the register signal;
a plurality of delay unit cells for controlling a delay amount of the second multi clock based on an output of the first logic combination unit; and
an output controller turned on in response to the delay control signal for outputting plural signals supplied at plural delay unit cells as the first multi clock.

4. The delay locked loop as recited in claim 3, wherein the first logic combination unit includes plural logic NAND gates for performing a logic NAND operation.

5. The delay locked loop as recited in claim 3, wherein the plurality of delay unit cells form a delay path for a reference clock signal input to a predetermined delay unit cell based on the output of the first logic combination unit when the register signal is in a logic high level.

6. The delay locked loop as recited in claim 3, wherein the output controller includes plural transmission gates, each coupled between each delay unit cell and each output terminal, turned on based on the delay control signal.

7. The delay locked loop as recited in claim 6, wherein, at a predetermined operation time, one of the plural transmission gates is turned off and others of the plural transmission gates are turned on.

8. The delay locked loop as recited in claim 7, wherein the number of the transmission gates is determined by a mode register set (MRS).

9. The delay locked loop as recited in claim 7, wherein the number of turn-on transmission gates is determined by a fuse-cut.

10. The delay locked loop as recited in claim 9, wherein the output controller includes plural transmission gates, each coupled between one of the delay unit cells and each output terminal, turned on based on the delay control signal.

11. The delay locked loop as recited in claim 1, wherein the multi-phase delay control block further includes at least one bi-directional shift register.

12. The delay locked loop as recited in claim 2, wherein the phase controller includes:
   a phase comparison unit for comparing the first multi clock with the second multi clock;
   a first flip-flop unit for performing a flip-flop operation of the multi-clocks; and
   a third logic combination unit for performing a logic operation of outputs of the phase comparison unit and the first flip-flop unit to generate the phase control signal.

13. The delay locked loop as recited in claim 12, wherein the phase comparator includes:
   a delay cell for delaying the feed-back internal signal and the rising or falling clock with a predetermined time;
   a logic block for comparing the feed-back internal signal, the rising or falling clock and a delayed feed-back internal signal and a delayed rising or falling clock outputted from the delay cell to output a comparison result; and
   a delay acceleration mode control unit for enabling a delay acceleration mode based on the comparison result and the second multi clock.

14. The delay locked loop as recited in claim 13, wherein a delay amount of the delay cell is determined by a mode register set (MRS).

15. The delay locked loop as recited in claim 13, wherein a delay amount of the delay cell is determined by a fuse-cut.

16. The delay locked loop as recited in claim 13, wherein the delay cell includes a RC delay element.

17. The delay locked loop as recited in claim 12, wherein the first flip-flop unit includes a T-flip-flop.

18. The delay locked loop as recited in claim 12, wherein the third logic combination unit includes plural logic NAND gates for performing a logic NAND operation of outputs of the phase comparator and the first flip-flop unit.

19. The delay locked loop as recited in claim 12, wherein the phase control signal includes an even right shift signal, an odd right shift signal, an even left shift signal and an odd left shift signal.

20. A delay locked loop, comprising:
   a clock buffer configured to receive an input clock signal and to buffer the input clock signal to generate rising and falling clocks;
   a clock delay compensation block configured to receive the rising and falling clocks and to generate a first multi clock and a second multi clock in response to the rising and falling clocks received from the clock buffer;
   a phase control block configured to receive the first multi clock and the second multi clock and to generate a phase control signal controlling a shifting operation based on the first multi clock and the second multi clock; and
   a multi-phase delay control block configured to perform the shifting operation and to control the clock delay compensation block in response to the phase control signal,
   wherein the multi-phase delay control block further includes at least one bi-directional shift register.

21. The delay locked loop as recited in claim 20, wherein the clock delay compensation block includes:
   a phase comparator for comparing the rising and the falling clocks with a feed-back internal clock to output a comparison result;
   a delay controller for performing a shifting operation based on the comparison result to generate a register signal controlling a phase delay amount;
   a multi-phase delay line for delaying the rising and the falling clocks based on the comparison result to generate the second multi clock and generating the first multi clock in response to a delay control signal outputted from the multi-phase delay control block, wherein the first multi clock has a different phase with the second multi clock;
   a dummy delay line for delaying one of output signals of the clock buffer;
   a replica model for delaying an output of the dummy delay line by a predetermined amount modeled based on delay elements to generate the feed-back internal signal; and
   an output buffer for synchronizing data input through a data bus with the second multi clock to generate the synchronized data.

22. The delay locked loop as recited in claim 21, wherein the multi-phase delay line includes:
   a first logic combination unit for generating a logic operation of the rising or falling clock and the register signal;
   a plurality of delay unit cells for controlling a delay amount of the second multi clock based on an output of the first logic combination unit; and
   an output controller turned on in response to the delay control signal for outputting plural signals supplied at plural delay unit cells as the first multi clock.

23. The delay locked loop as recited in claim 22, wherein the first logic combination unit includes plural logic NAND gates for performing a logic NAND operation.

24. The delay locked loop as recited in claim 22, wherein the plurality of delay unit cells form a delay path for a reference clock signal input to a predetermined delay unit cell based on the output of the first logic combination unit when the register signal is in a logic high Level.

25. The delay locked loop as recited in claim 22, wherein the output controller includes plural transmission gates, each coupled between each delay unit cell and each output terminal, turned on based on the delay control signal.

26. The delay locked loop as recited in claim 20, wherein the multi-phase delay control block further includes:
   a switching unit for controlling a left-shift or right-shift operation in response to the phase control signal;
   a latching unit for latching an output of the switching unit; and
   a second logic combination unit for performing a logic operation on outputs of the switching unit to generate a delay control signal for controlling the clock delay compensation block.

* * * * *